United States Patent [19]

Silverglate

[11] Patent Number: 4,869,580
[45] Date of Patent: Sep. 26, 1989

[54] IMMERSION CARTESIAN OVOID LENS
[75] Inventor: David Silverglate, Soquel, Calif.
[73] Assignee: Quality Technologies Corporation, Palo Alto, Calif.
[21] Appl. No.: 933,383
[22] Filed: Nov. 21, 1986
[51] Int. Cl.$^4$ .......................... G02B 3/02; G02B 27/00
[52] U.S. Cl. .................................................... 350/432
[58] Field of Search ......................... 350/432; 250/239

[56]  References Cited
U.S. PATENT DOCUMENTS

| | | | |
|---|---|---|---|
| 3,914,309 | 10/1975 | Swensen | 250/239 |
| 4,042,821 | 8/1977 | Mierzwinski | 250/239 |
| 4,515,432 | 5/1985 | Sherwin | 350/96.2 |

OTHER PUBLICATIONS

Southall; *Mirrors, Prisms, and Lenses*; The MacMillian Company; 1923; pp. 617–625.

Primary Examiner—Bruce Y. Arnold
Assistant Examiner—Rebecca D. Gass
Attorney, Agent, or Firm—James & Franklin

[57] ABSTRACT

A substantially solid transparent body focuses light from an LED wholly immersed therein to a point external to the body. The body is composed of a substantially non-heat-conducting plastic material and has a surface with the curvature of a Cartesian Ovoid substantially in accordance with the formula $L_o \times N_o \times L_i \times N_i = C$, where $L_o$ is the distance from a point on the surface to the external point;
$L_i$ is the distance from the LED to the point on the surface;
$N_o$ is the index of refraction in air; and
$N_i$ is the index of refraction of the plastic material.

5 Claims, 3 Drawing Sheets

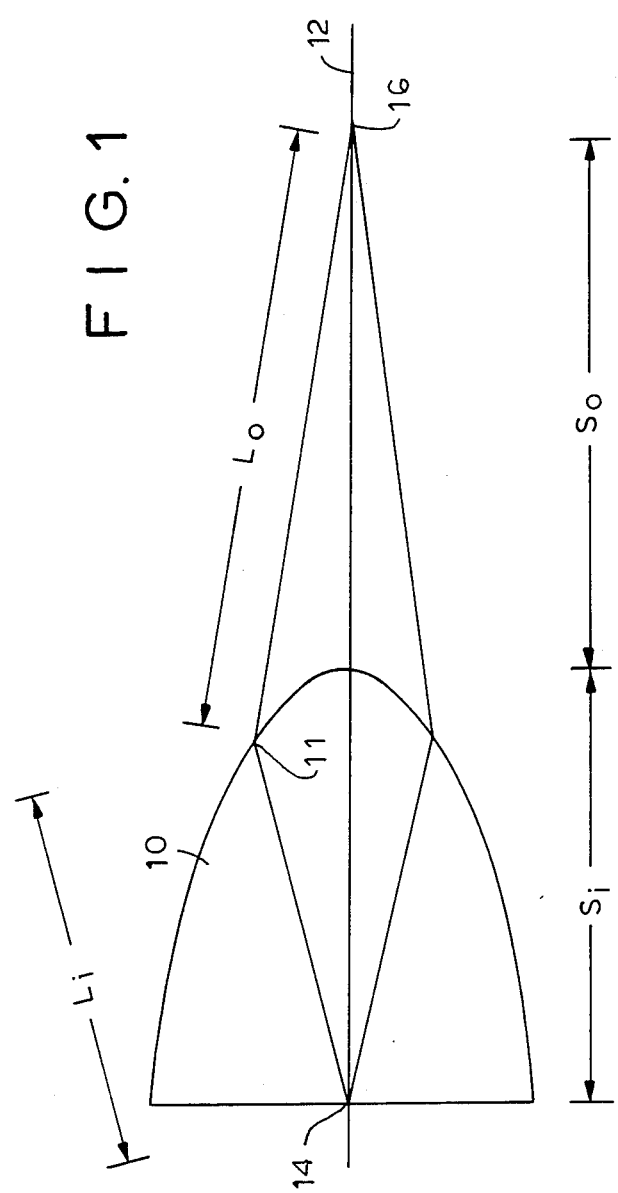
F I G. 1
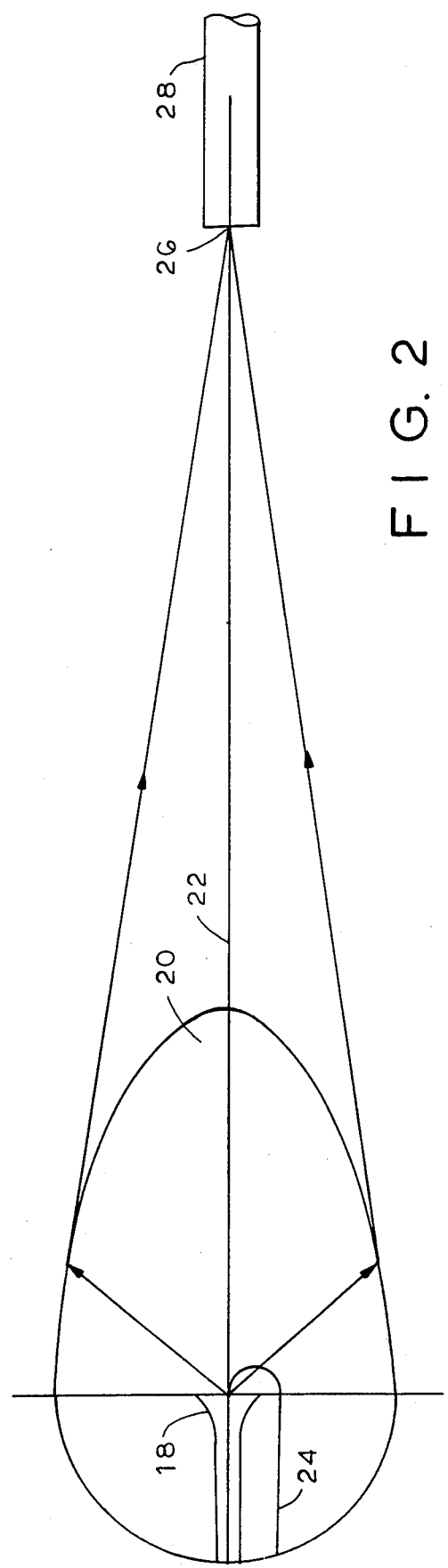
F I G. 2

IMMERSION CARTESIAN OVOID LENS

The present invention relates to lenses which can be effectively employed in conjunction with a light source and/or a photo-detector for use relatively inexpensively in high resolution optical scanners, optoisolators, optical switches, or the like and, more particularly, to a plastic molded lens with an immersed LED light source which has a surface in the shape of a truncated Cartesian Oval of revolution.

Lenses of various materials and shapes have been used to focus light for centuries. Glass and, more recently, plastic materials have been formed into various surface configurations to perform specific tasks such as focusing light on a point or collimating light from a point source.

Centuries ago, Christiaan Huygens wrote a treatise entitled "On Light." In that treatise, Huygens included a chapter on the properties of certain transparent bodies in which he discloses a particular ovoid of revolution, known as a "Cartesian Ovoid", named after Renee Des Cartes. The Cartesian Ovoid is a theoretical transparent body which has a surface capable of reassembling light rays emanating from a first point source such that they converge on a second point. Both of the points are located on a single optical axis, one internal to the body and the other external.

The theory of the Cartesian Ovoid is explained by Huygens and, hence, known by mathematicians and physicists for many years. It has, however, been impossible to put this theory to practical use because, in order to implement the theory, it is necessary that a point light source be totally immersed within the solid transparent body of the lens. A light source which is also heat generating, however, cannot be immersed in a solid body, because the heat generated by the light source cannot be dissipated sufficiently quickly through the material of the solid body. Accordingly, heat build-up results and, within a relatively short time, the light source is destroyed by overheating.

However, recently, light sources in the form of light emitting diodes (LEDs) have been invented which generate only minimal heat. It is therefore possible to wholly immerse an LED within a solid plastic body. The leads will conduct the small amount of heat generated by the LED to the outside of the lens. Consequently, an immersed light source can now be utilized in a solid plastic lens body.

In general, the present invention relates to an inexpensive lens which includes a solid body with a Cartesian Ovoid surface having a light emitting diode wholly immersed therein at a point which will permit the lens to focus the light generated by the LED onto a particular external point. The external point may be, for example, a photo-detector of the fiber optic type. In addition, as explained in detail below, a second lens can be used with an immersed photo-detector. The combination forms an excellent optoisolator, optical switch or reflective optical detector, particularly if the geometry of the system is properly selected. For example, the source lens can produce a relatively narrow output cone angle whereas the receiving lens can have a relatively wide acceptance angle.

It is, therefore, a prime object of the present invention to provide an inexpensive Cartesian Ovoid lens which can be used with a light emitting diode.

It is another object of the present invention to provide a Cartesian Ovoid lens capable of focusing light on an external point.

It is another object of the present invention to provide an immersion Cartesian Ovoid lens which can be used in conjunction with a photo-detector, such as a fiberoptic photo-detector.

It is another object of the present invention to provide an immersion Cartesian Ovoid lens which can be utilized for both emitting and detecting in an optical scanner, optoisolator, optical switch, or reflective optical detector.

It is another object of the present invention to provide an immersion Cartesian Ovoid lens wherein the geometry can be altered to obtain the maximum focused light output at a narrow output cone angle.

It is another object of the present invention to provide an immersion Cartesian Ovoid lens wherein the geometry can be altered such that a detector is provided with a large acceptance cone angle.

To these and to such other objects as may hereinafter appear, the present invention relates to an immersion Cartesian Ovoid lens, as described in the following specification and recited in the annexed claims, taken together with the accompanying drawings, wherein like numerals refer to like parts, and in which:

FIG. 1 is a diagram illustrating the mathematical properties of a Cartesian Ovoid;

FIG. 2 is a plan view of an immersion Cartesian Ovoid lens of the present invention, as used in conjunction with a light-emitting diode;

Figure 3:
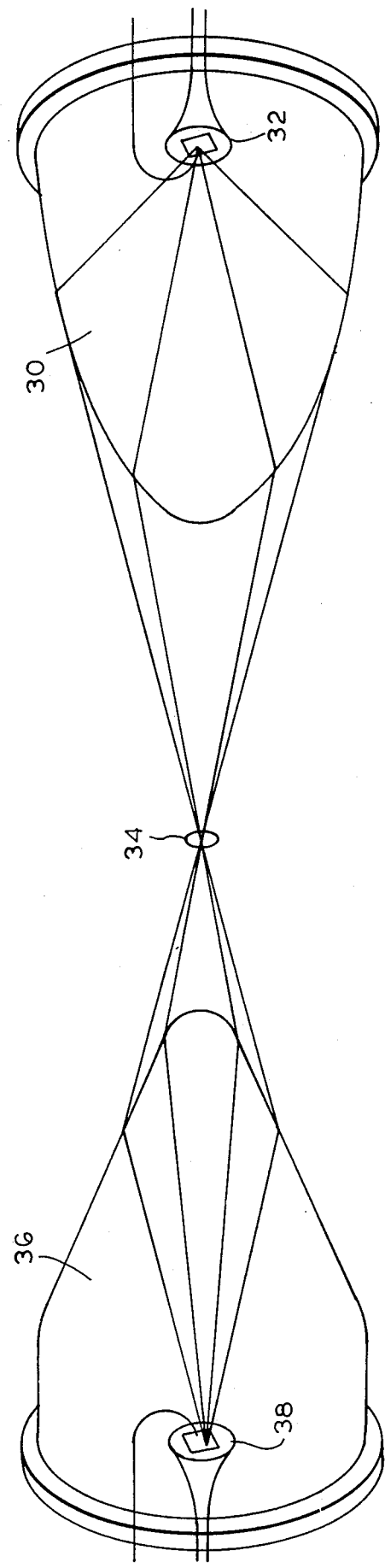
FIG. 3 is a side view of a pair of immersion Cartesian Ovoid lenses of the present invention forming an optical switch, such as an optoisolator.

As illustrated in FIG. 1, a theoretical Cartesian Ovoid comprises a solid, transparent body 10 which is symmetrical about an optical axis 12. In this Figure, the distance between point 14, immersed in body 10, and a point 11 on the surface of body 10 is noted as $L_i$. The distance from point 11 on the surface of the lens to an external point 16 is designated as $L_o$. Points 14 and 16 are both on optical axis 12. If $N_i$ is the index of refraction of the material from which body 10 is formed and $N_o$ is the index of refraction in air, then the formula for the Cartesian Ovoid is:

$$L_o \times N_o + L_i \times N_i = \text{Constant}.$$

If point 14 is considered to be the point where a point light source is situated, then the light from the source will all focus on external point 16. By altering the emitter width, lens diameter and shape, it is possible to change the emittance angle. For example, if $S_i$ is the minimum distance between point 14 and point 11 on the surface of the lens along the optical axis 12, and $S_o$ is the minimum distance between point 11 on the lens surface and point 16 along the optical axis, then the ratio of $S_i/S_o$ can be optimized to provide a maximum focused light output from the emitter at point 14 and, hence, a narrow output cone angle.

FIG. 2 illustrates perhaps the simplest practical application of the Cartesian Ovoid lens. Using a very inexpensive process, a conventional light emitting diode 18 is wholly immersed in a molded transparent solid body 20, composed of substantially non-heat-conducting plastic, at a point along optical axis 22. LED 18 has leads 24, which extend out the rear of body 20 and conduct any heat from the LED 18 out of body 20. Body 20 focuses the light emitted from LED 18 at a point 26 on the optical axis 22 along which is located a fiberoptic type detector 28 of conventional design. By making the ratio $S_i/S_o$ as small as possible, the emitter cone angle can be made larger than the detector acceptance angle so as to provide for maximum efficiency. Detector 28 could be replaced by a light-sensitive paper (not shown). The maximum light flux could then be focused onto a spot on the paper for light sensitive printing.

Another practical application of the present invention is illustrated in FIG. 3. FIG. 3 shows two immersed Cartesian Ovoid lenses 30, 36 in accordance with the present invention, set up as an optical switch or optocoupler. The emitter part includes a solid plastic transparent molded body 30 having the shape of a Cartesian Ovoid with an immersed LED 32 therein. Light from LED 32 is focused on a point 34 which is on the optical axis of the emitter part. The detector part includes a Cartesian Ovoid lens body 36 with a detector 38 immersed therein. The shape of body 30 is somewhat different from the shape of body 36 such that the emitter part has a relatively wide output angle whereas the detector part has a relatively narrow acceptance angle. Thus, $S_i/S_o$ for the emitter part is smaller than for the detector part. Point 34 is the confocal point.

Figure 4:
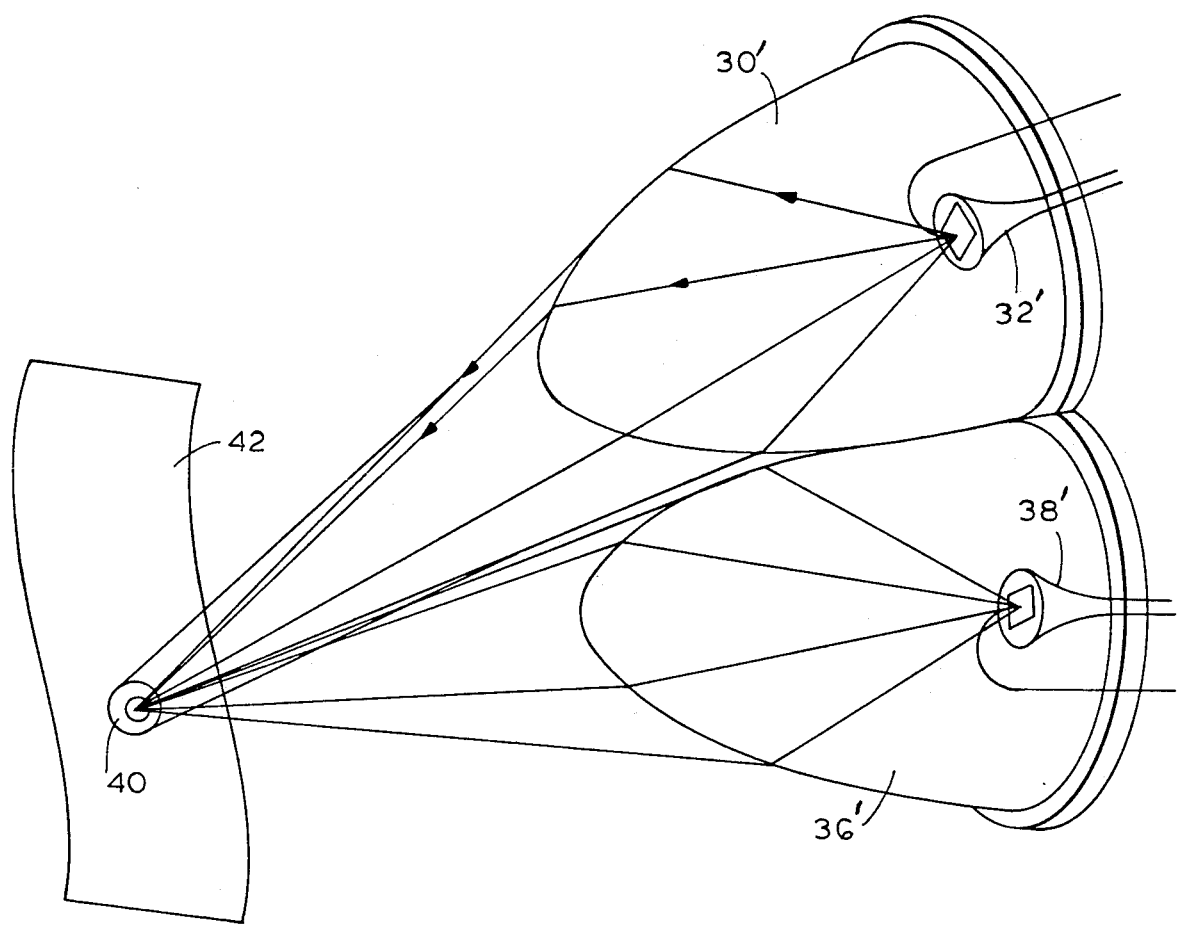
FIG. 4 is a side view of a pair of immersion Cartesian Ovoid lenses of the present invention forming a reflective optical detector.

FIG. 4 discloses another practical embodiment of the present invention which can be used for optical scanning and the like. This embodiment is similar to that shown in FIG. 3, except that the emitter part and the detector part no longer face each other, but form a single unit with both parts facing in the same direction. The emitter part is used to illuminate a spot 40 on a reflective surface 42. The emitter part again has a body 30' and an LED 32' and the detector has a body 36' and a photo-detector 38'. The emitter has a relatively wide output angle and, hence, illuminates a fairly large spot on the surface of object 42. The detector has a relatively narrow acceptance angle and, hence, detects a spot which is somewhat smaller than the spot illuminated by the emitter.

It will now be appreciated that the present invention relates to a lens which includes a substantially solid transparent body for focusing light from an LED immersed therein. The light is focused on a point external to the body, along the optical axis thereof. The body is composed of a substantially non-heat-conducting plastic material and has a surface with a Cartesian Ovoid curvature. By altering the geometry of the lens, the width of the output angle can be varied as needed. By using the lens of the present invention to form the emitter and the detector of an optical switch or the like, maximum efficiency and high resolution can be achieved.

While only a limited number of preferred embodiments have been disclosed herein for purposes of illustration, it is obvious that many variations and modifications could be made thereto. It is intended to cover all of these variations and modifications which fall within the scope of the present invention as defined by the following claims:

I claim:
1. An optical switch comprising first and second light focusing means, each of said light focusing means comprising a transparent solid body for focusing light between a point on the optical axis internal to said body and a point on the optical axis external to said body, said body being composed of a substantially non-heat-conducting plastic material and having a surface with a curvature in accordance with:

$$L_o \times N_o + L_i \times N_i = \text{Constant}$$

where:
$L_o$ is the distance from a point on said surface to said external point;
$L_i$ is the distance from said point on said surface to said internal point;
$N_o$ is the index of refraction in air;
$N_i$ is the index of refraction of said material; an LED located at said internal point and immersed in said body of said first means and light detector means located at said internal point in said body of said second means, said external point of said first means and said external point of said second means substantially coinciding.

2. The apparatus of claim 1, wherein said first means has a wide output angle.

3. The apparatus of claim 1, wherein said second means has a narrow input angle.

4. The apparatus of claim 1, wherein $S_o$ equals the minimum $L_o$, $S_i$ equals the minimum $L_i$ and wherein $S_i/S_o$ is smaller for said first means than for said second means.

5. The apparatus of claim 1, wherein said external point is on an object and t detected light is reflected from said object.

* * * * *